(12) United States Patent
Limary et al.

(10) Patent No.: US 9,466,511 B2
(45) Date of Patent: Oct. 11, 2016

(54) SYSTEMS AND METHODS FOR DRYING HIGH ASPECT RATIO STRUCTURES WITHOUT COLLAPSE USING STIMULI-RESPONSIVE SACRIFICIAL BRACING MATERIAL

(71) Applicant: Lam Research Corporation, Fremont, CA (US)

(72) Inventors: Ratchana Limary, Austin, TX (US); Stephen Sirard, Austin, TX (US)

(73) Assignee: LAM RESEARCH CORPORATION, Fremont, CA (US)

(*) Notice: Subject to any disclaimer, the term of this patent is extended or adjusted under 35 U.S.C. 154(b) by 0 days.

(21) Appl. No.: 14/489,615

(22) Filed: Sep. 18, 2014

(65) Prior Publication Data

US 2016/0086829 A1    Mar. 24, 2016

(51) Int. Cl.
| | | |
|---|---|---|
| *H01L 21/67* | (2006.01) | |
| *H01L 21/02* | (2006.01) | |
| *F26B 5/00* | (2006.01) | |

(52) U.S. Cl.
CPC .......... *H01L 21/67034* (2013.01); *F26B 5/00* (2013.01); *H01L 21/02057* (2013.01); *H01L 21/02082* (2013.01); *H01L 21/67028* (2013.01)

(58) Field of Classification Search
None
See application file for complete search history.

(56) References Cited

U.S. PATENT DOCUMENTS

| | | | |
|---|---|---|---|
| 5,571,447 A * | 11/1996 | Ward | C09K 13/08 252/79.3 |
| 6,072,006 A | 6/2000 | Bantu et al. | |
| 6,337,277 B1 | 1/2002 | Chou et al. | |
| 7,687,406 B2 | 3/2010 | Daley et al. | |
| 8,058,178 B1 | 11/2011 | Goto et al. | |
| 8,187,951 B1 | 5/2012 | Wang et al. | |
| 2002/0132184 A1 | 9/2002 | Babcock | |
| 2002/0168785 A1 | 11/2002 | Paz de Araujo et al. | |
| 2003/0045098 A1 | 3/2003 | Verhaverbeke et al. | |
| 2005/0106493 A1 | 5/2005 | Ho et al. | |
| 2011/0189858 A1 | 8/2011 | Yasseri et al. | |
| 2013/0143406 A1 | 6/2013 | Hsu et al. | |
| 2014/0373384 A1* | 12/2014 | Sirard | H01L 21/02057 34/357 |

OTHER PUBLICATIONS

U.S. Appl. No. 13/924,314, filed Jun. 21, 2013, Stephen M. Sirard et al.
U.S. Appl. No. 14/489,615, Limary et al.
U.S. Appl. No. 14/507,080, Sirard, et al.
U.S. Appl. No. 14/730,457, Sirard, et al.
DiLauro, Anthony M., and Phillips, Scott T.; "Continuous Head-to-Tail Depolymerization: An Emerging Concept for Imparting Amplified Responses to Stimuli-Responsive Materials;" MacroLetter; American Chemical Society Publications; pp. 298-304; Published Mar. 12, 2014.

(Continued)

*Primary Examiner* — Duy Deo

(57) ABSTRACT

Systems and methods for drying a substrate including a plurality of high aspect ratio (HAR) structures is performed after at least one of wet etching and/or wet cleaning the substrate using at least one of wet etching fluid and/or wet cleaning fluid, respectively, and without drying the substrate. Fluid between the plurality of HAR structures is displaced using a solvent including a bracing material. After the solvent evaporates, the bracing material precipitates out of solution and at least partially fills the plurality of HAR structures. The plurality of HAR structures are exposed to non-plasma based stimuli to remove the bracing material.

17 Claims, 6 Drawing Sheets

(56) References Cited

OTHER PUBLICATIONS

DiLauro, Anthony M., Zhang, Hua, Baker, Matthew S., Sen, Flory Wong Ayusman, and Phillips, Scott T.; Accessibility of Responsive End-Caps in Films Composed of Stimuli-Responsive, Depolymerizable Poly(phthalaldehydes); Macromolecules; American Chemical Society Publications; pp. 7257-7265; Published Sep. 12, 2013.

Kokubo, Ken, Shirakawa, Shogo, Kobayashi, Naoki, Aoshima, Hisae and Oshima, Takumi; "Facile and Scalable Synthesis of a Highly Hydoxylated Water-Soluble Fullerenol as a Single Nanoparticle;" Nano Research; pp. 204-215; Nov. 1, 2010.

Robbins, Jessica S., Schmid, Kyle M. and Phillips. Scott T.; "Effects of Electronics, Aromaticity, and Solvent Polarity on the Rate of Azaquinone-Methide-Mediated Depolymerization of Aromatic Carbamate Oligomers;" The Journal of Organic Chemistry; pp. 3159-3169; Published Feb. 18, 2013.

Seo, Wanji and Phillips, Scott T.; "Patterned Plastics that Change Physical Structure in Response to Applied Chemical Signals;" JACS Communications; pp. 9234-9235; Published Online Jun. 21, 2010.

Viger, Mathieu L., Grossman, Madeline, Fomina, Nadezda, and Almutairi, Adah; "Low Power Upconverted Near-IR Light for Efficient Polymeric Nanoparticle Degradation and Cargo Release;" Advanced Materials; pp. 3733-3738; 2013.

* cited by examiner

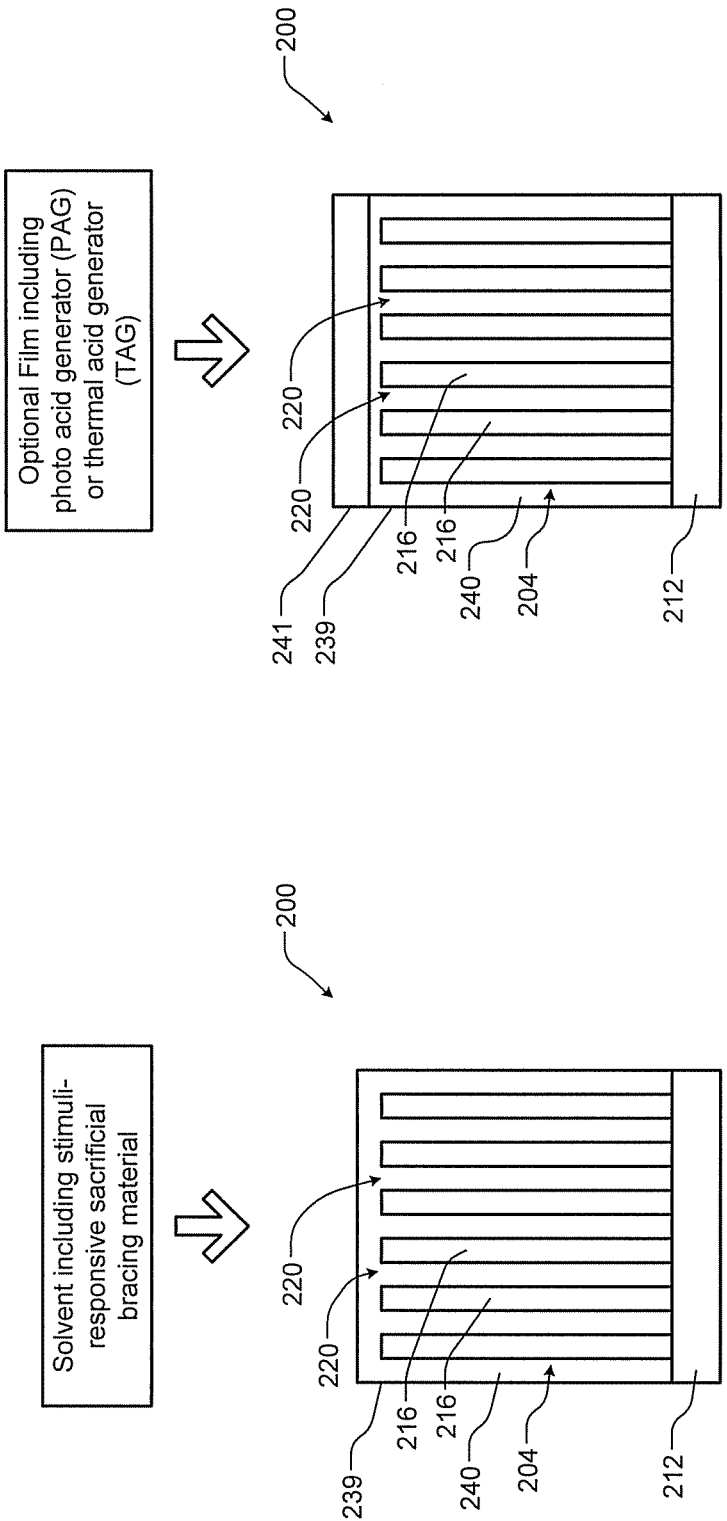

SYSTEMS AND METHODS FOR DRYING HIGH ASPECT RATIO STRUCTURES WITHOUT COLLAPSE USING STIMULI-RESPONSIVE SACRIFICIAL BRACING MATERIAL

FIELD

The present disclosure relates to systems and methods for processing substrates, and more particularly to systems and methods for drying high aspect ratio (HAR) structures of a substrate without collapse.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Fabrication of substrates such as semiconductor wafers typically requires multiple processing steps that may include material deposition, planarization, feature patterning, feature etching, and/or feature cleaning. These processing steps are typically repeated one or more times during processing of the substrate.

As semiconductor devices continue to scale down to smaller feature sizes, high aspect ratio (HAR) structures are increasingly required to achieve desired device performance objectives. The use of the HAR structures creates challenges for some of the substrate processing steps. For example, wet processes such as etching and cleaning pose problems for the HAR structures due to capillary forces that are generated during drying of the substrate. The strength of the capillary forces depends upon surface tension, a contact angle of the etching, cleaning, or rinsing fluids that are being dried, feature spacing and/or an aspect ratio of the structures. If the capillary forces generated during drying are too high, the HAR structures will become strained or collapse onto each other and stiction may occur, which severely degrades device yield.

To solve this problem, one approach uses rinsing liquids that have a lower surface tension than deionized water to prevent the structures from collapsing. While generally successful for relatively low aspect ratio structures, this approach has the same collapse and stiction issues as methods that use deionized water. The rinsing fluids still possess a finite amount of surface tension that generates forces during drying that are still too strong for the fragile HAR structures.

An alternative approach for drying HAR structures involves dissolving and flushing the rinsing fluid with a supercritical fluid. Supercritical fluids are free of surface tension when processed correctly. However, several technical and manufacturing challenges arise when using the supercritical fluids. The challenges include high equipment and safety costs, long process times, variable solvent quality during the process, extreme sensitivity due to the diffuse and tunable nature of the fluid, and wafer defectivity/contamination issues arising from the interaction of the supercritical fluid with components of the processing chamber.

Another strategy for preventing collapse of high aspect ratio structures is to add a permanent mechanical bracing structure that supports the structures. There are several tradeoffs with this approach including higher cost and process complexity that negatively impact throughput and yield. Furthermore, permanent mechanical bracing structures are limited to supporting certain types of HAR structures.

Freeze drying has also been proposed as an alternative approach for drying HAR structures. Freeze drying eliminates collapse by initially freezing the solvent and then directly sublimating under vacuum. Freeze drying avoids the liquid/vapor interface, which minimizes capillary forces. While showing promise, freeze drying has relatively high cost, low throughput and high defects as compared to competing approaches.

Surface modification of sidewalls of the HAR structures may also be performed. In this approach, small molecules may be chemically bonded to the sidewalls of the HAR structures. The small molecules improve collapse performance by either preventing the stiction of materials when they make contact or by altering a contact angle of the wet chemistry to minimize Laplace pressure. Surface modification does not fully eliminate the drying forces and the structures deform during the drying process, which may cause damage. Furthermore, when surface materials are changed, new tailored molecules are required to bond to the sidewalls of the HAR structures.

SUMMARY

A method for drying a substrate including a plurality of high aspect ratio (HAR) structures is performed after at least one of wet etching and/or wet cleaning the substrate using at least one of wet etching fluid and/or wet cleaning fluid, respectively, and without drying the substrate. The method includes displacing fluid between the plurality of HAR structures using a solvent including a bracing material. After the solvent evaporates, the bracing material precipitates out of solution and at least partially fills the plurality of HAR structures. The plurality of HAR structures are exposed to non-plasma based stimuli to remove the bracing material.

In other features, the bracing material is polymer-based. The method further includes, prior to the exposing, depositing a film including a photo acid generator. The non-plasma based stimuli includes radiation.

In other features, the method includes, prior to the exposing, depositing a film including a thermal acid generator. The non-plasma based stimuli includes elevated temperature.

In other features, the non-plasma based stimuli are provided at a top portion of the plurality of HAR structures. In response to the non-plasma based stimuli, a degradation front moves through the bracing material from a top portion of the bracing material adjacent to the top portion of the plurality of HAR structures to a bottom portion of the bracing material adjacent to a bottom portion of the plurality of HAR structures.

In other features, the fluid between the plurality of HAR structures that is displaced comprises the at least one of the wet etching fluid and/or the wet cleaning fluid. The method includes replacing the at least one of the wet etching fluid and/or the wet cleaning fluid with a transition fluid. The fluid that is displaced includes the transition fluid. The non-plasma based stimuli initiates polymer chain scission in the bracing material. The non-plasma based stimuli initiates depolymerization in the bracing material.

In other features, the non-plasma based stimuli includes at least one of ultraviolet (UV) light, one or more chemicals, one or more chemical vapors, and/or elevated temperature. The solvent including the bracing material is applied to the substrate using spin-coating.

In other features, the method is performed in a processing chamber and further comprising reducing pressure in the processing chamber during and/or after exposing the plurality of HAR structures to the non-plasma based stimuli. The method is performed in a processing chamber. The at least one of the wet etching and/or the wet cleaning are also performed in the processing chamber.

In other features, the bracing material includes poly(para-methoxy-a-methyl styrene) and the non-plasma based stimuli includes at least one of acid and/or temperature. In other features, the acid includes at least one of hydrobromic acid and/or trifluoroacetic acid.

In other features, the bracing material includes poly (phthalaldehyde) and the non-plasma based stimuli includes at least one of acid and/or temperature. The bracing material includes poly(methyl tetrahydronaphthalene) derivative and the non-plasma based stimuli includes acid.

A system for drying a substrate including a plurality of high aspect ratio (HAR) structures includes a processing chamber and a substrate support arranged in the processing chamber. A fluid delivery system is configured to deliver fluid to the substrate. A controller is in communication with the fluid delivery system and is configured to, after one of wet etching or wet cleaning the substrate using at least one of wet etching fluid and/or wet cleaning fluid, respectively, and without drying the substrate: cause the fluid delivery system to displace fluid between the plurality of HAR structures using a solvent including a bracing material. After the solvent evaporates, the bracing material precipitates out of solution and at least partially fills the plurality of HAR structures. The controller is configured to expose the plurality of HAR structures to non-plasma based stimuli to remove the bracing material.

In other features, the controller is configured to, prior to the exposing, deposit a film including a photo acid generator. The non-plasma based stimuli includes radiation.

In other features, the controller is configured to, prior to the exposing, deposit a film including a thermal acid generator. The non-plasma based stimuli includes elevated temperature.

In other features, the bracing material is polymer-based. The non-plasma based stimuli is provided at a top portion of the plurality of HAR structures. In response to the non-plasma based stimuli, a degradation front moves through the bracing material from a top portion of the bracing material adjacent to the top portion of the plurality of HAR structures to a bottom portion of the bracing material adjacent to a bottom portion of the plurality of HAR structures.

In other features, the fluid between the plurality of HAR structures that is displaced comprises at least one of the wet etching fluid and/or the wet cleaning fluid. The controller is configured to cause the fluid delivery system to replace the at least one of the wet etching fluid and/or the wet cleaning fluid with a transition fluid. The fluid that is displaced includes the transition fluid. The non-plasma based stimuli initiates at least one of polymer chain scission and/or depolymerization in the bracing material.

In other features, the non-plasma based stimuli includes at least one of ultraviolet (UV) light, one or more chemicals, one or more chemical vapors, and/or temperature.

In other features, a motor rotates the substrate support and the controller is configured to apply the solvent including the bracing material to the substrate by spinning the substrate using the motor.

In other features, the controller is configured to reduce pressure in the processing chamber at least one of during and/or after exposing the plurality of HAR structures to the non-plasma based stimuli. The controller is configured to initiate the one of the wet etching and/or the wet cleaning in the processing chamber.

In other features, the polymer in the bracing material includes poly(para-methoxy-a-methyl styrene) (PMaMS) and the non-plasma based stimuli includes at least one of acid and/or temperature. The acid includes at least one of hydrobromic acid and/or trifluoroacetic acid.

In other features, the polymer in the bracing material includes poly(phthalaldehyde) derivative (PPAA) and the non-plasma based stimuli includes at least one of acid and/or temperature. The polymer in the bracing material includes poly(methyl tetrahydronaphthalene) derivative (polyformal) and the non-plasma based stimuli includes acid.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A-2E are side views illustrating an example of the substrate during drying using stimuli-responsive sacrificial bracing according to the present disclosure;

In the drawings, reference numbers may be reused to identify similar and/or identical elements.

DETAILED DESCRIPTION

Figure 1:
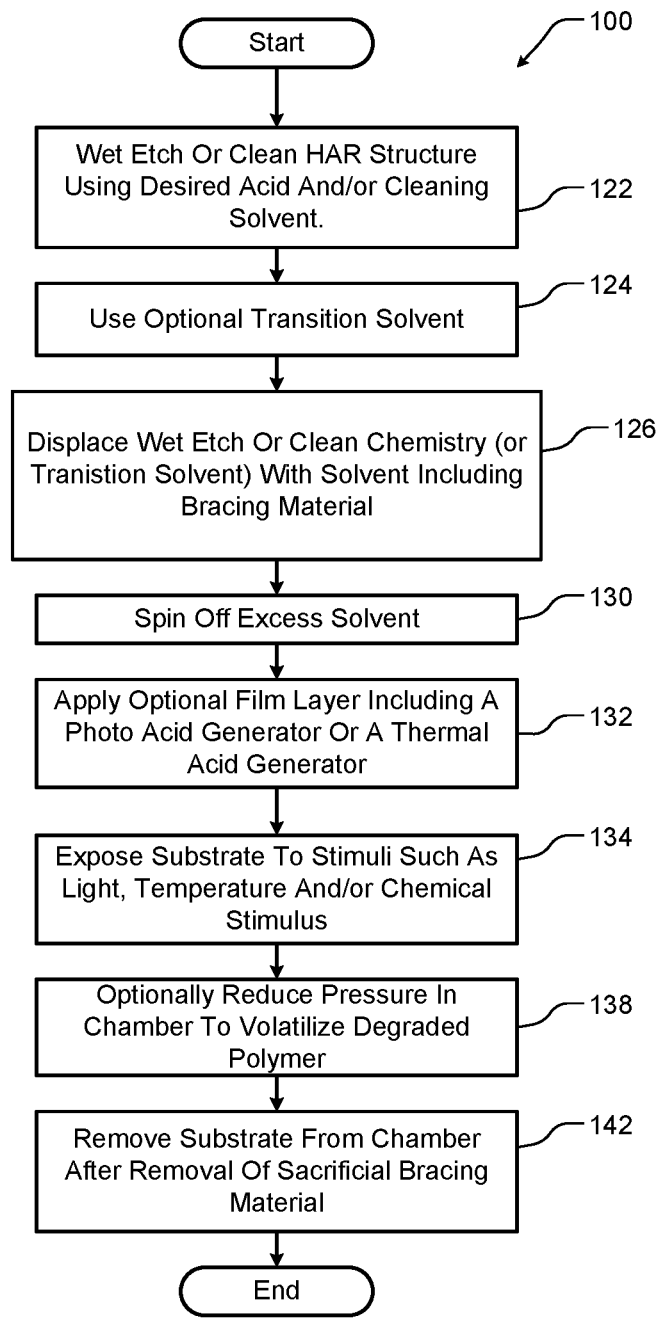
FIG. 1 is a flowchart illustrating an example of a method for using stimuli-responsive sacrificial bracing for drying a HAR structure of a substrate according to the present disclosure.

Some sacrificial bracing methods have been used to prevent collapse of high aspect ratio (HAR) structures. For example only, commonly-assigned U.S. patent application Ser. No. 13/924,314, filed on Jun. 21, 2013, and entitled "Method of Collapse-Free Drying of High Aspect Ratio Structures", which is hereby incorporated by reference in its entirety, discloses a sacrificial bracing method. As described therein, a sacrificial bracing material, such as a glassy polymer or fullerene solution, is deposited into the HAR structures directly after the cleaning or wet etching process, but prior to drying the wafers. The sacrificial bracing material displaces the wet etching or cleaning solution. As the solvent evaporates, the sacrificial bracing material precipitates out of solution and fills the HAR structures. A mechanical brace is formed in between the HAR structures to counter the capillary forces that are generated during solvent drying. Afterwards, the sacrificial bracing material is removed with a dry plasma process.

The dry plasma process is typically downstream and uses reactants such as $N_2/O_2$ or $N_2$-rich/$H_2$ gases. The sacrificial bracing method has been successfully demonstrated on HAR shallow trench isolation (STI) structures with ARs as high as ~20:1. However, removal of the sacrificial bracing structure using these plasma processes may cause surface modification. More particularly, $O_2$-rich or $N_2$-rich plasmas may chemically modify the surface of the HAR structures. The surface modification can either lead to charging and/or generate stresses that lead to structural collapse and/or stiction. Furthermore, the surface modification may modify the electrical properties of the device.

Systems and methods according to the present disclosure use a stimuli-responsive material such as a polymer-based material as a sacrificial bracing material for collapse prevention during drying of high aspect ratio (HAR) structures. As used herein, HAR structures refers to structures having an aspect ratio (AR)≥8, 10, 12, 15, 20 or 50. The stimuli includes non-plasma based stimuli such as ultraviolet (UV) light, heat and/or chemicals such as acid. The sacrificial bracing material solidifies on and around the HAR structures to provide a mechanical brace and to prevent collapse of the HAR structures during drying. Subsequently, the mechanical brace is removed using the stimuli without leaving residues and without damaging the HAR structures.

After wet cleaning, a solvent including the sacrificial bracing material displaces the wet etching or cleaning solution in between the HAR structures. As the solvent evaporates, the sacrificial bracing material precipitates out of solution and fills the structures. A mechanical brace is formed in the HAR structures to counter the capillary forces that are generated during solvent drying. Stimuli such as acid, UV light and/or temperature are introduced to initiate polymer chain scission. As a result, the sacrificial bracing material degrades to create volatile monomers or other smaller molecular products. In some examples, the stimuli are provided at the top of the HAR structures. A degradation front commences from a top of the HAR structures at a vacuum/air interface and proceeds to the bottom of the HAR structures. Process variables such as dose, flow rate, concentration, pressure and/or temperature may be altered to control both the size and speed of the degradation front. The stimuli-responsive sacrificial bracing method allows complete removal of the sacrificial bracing material while preventing collapse of the fragile HAR structures.

Referring now to FIG. 1, an example of a method 100 for using stimuli-responsive sacrificial bracing for drying a plurality of HAR structures of a substrate is shown. At 122, wet etching or cleaning of a substrate including the plurality of HAR structures is performed using a desired wet etching acid and/or cleaning solution. Without drying the plurality of HAR structures, an optional transition solvent may be used at 124 in cases where there is a chemical mismatch between the desired wet etching acid or cleaning solution and the solvent including the polymer-based bracing material.

At 126, the wet etching or cleaning chemistry (or the transition solvent) is displaced using solvent containing stimuli-responsive sacrificial bracing material. At 130, the substrate may optionally be rotated by a spin coater to spin off excess solvent. As the solvent evaporates, the sacrificial bracing material precipitates out of solution and fills the HAR structures. A mechanical brace is formed in the HAR structures to counter the capillary forces that are generated during solvent drying.

In some examples, a film layer including either a photo acid generator (PAG) or thermal acid generator (TAG) is optionally deposited or applied on top of the bracing material at 132. The PAG or TAG film breaks down on top of the bracing material and then diffuses down. Exposing the PAG film to radiation or the TAG film to temperature creates a catalytic acid (stimuli) resulting in the depolymerization of the stimuli-responsive sacrificial bracing material.

At 134, the substrate is exposed to non-plasma based stimuli such as light, temperature and/or chemical stimulus such as acid or vaporized acid. A degradation front commences in the bracing material adjacent to a top portion of the HAR structure at a vacuum/air interface and proceeds to portions of the bracing material adjacent to a bottom portion of the HAR structure.

At 138, pressure in the processing chamber may optionally be reduced to volatilize the degraded polymer. At 142, the substrate may be removed from the processing chamber after removal of the sacrificial bracing material.

Figure 2A:
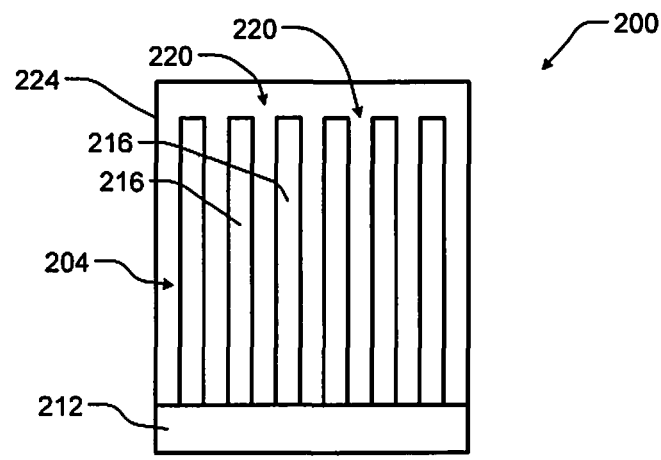
Figure 2B:
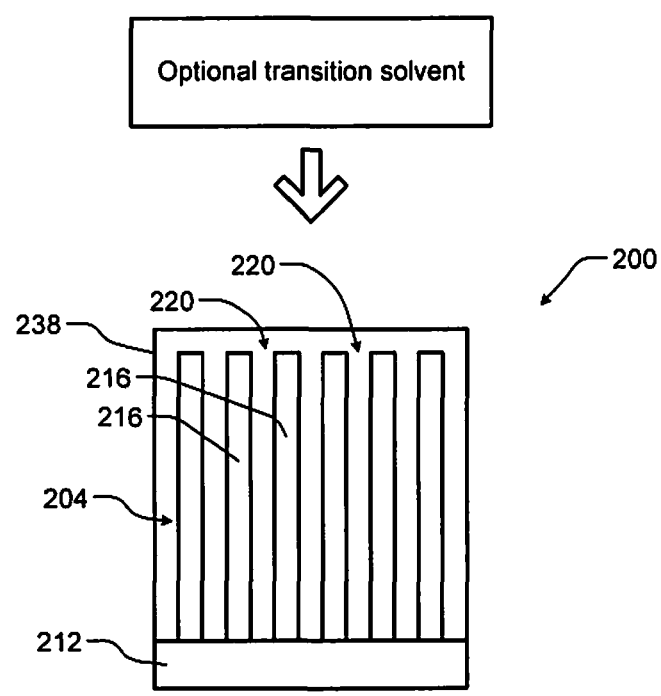
Figure 2E:
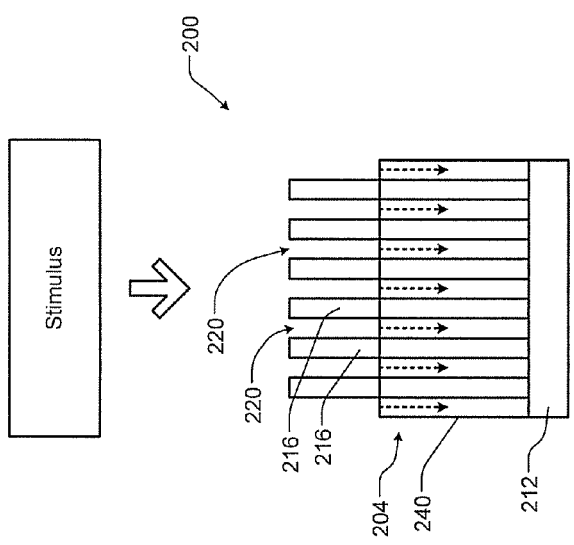

Referring now to FIGS. 2A-2E, an example of the substrate is shown during drying using stimuli-responsive sacrificial bracing. In FIG. 2A, a substrate 200 includes a plurality of HAR structures 204 extending from a base portion of a substrate 212. For example, the plurality of HAR structures 204 may include one or more pillars 216 that extend upwardly from the base portion of the substrate 212, although other HAR structures such as lines/spaces, capacitors, etc. are contemplated. Fluid 224 remains on the substrate 200 after wet etching or wet cleaning. For example only, the fluid 224 may be located between the pillars 216 as identified at 220. In FIG. 2B, an optional transition solvent 238 may be used to displace the fluid 224. In FIG. 2C, a solvent 239 including stimuli-responsive sacrificial bracing material 240 may be used to displace the fluid 224 or the optional transition solvent 238 (if used). After the solvent evaporates, the bracing material 240 precipitates out of solution and at least partially fills the plurality of HAR structures. In FIG. 2D, a film 241 including photo acid generator (PAG) or thermal acid generator (TAG) is optionally applied to the bracing material. In FIG. 2E, stimuli may be used to initiate polymer chain scission, depolymerization, or other mechanism to remove the bracing material 240 without damaging the plurality of HAR structures.

Figure 3:
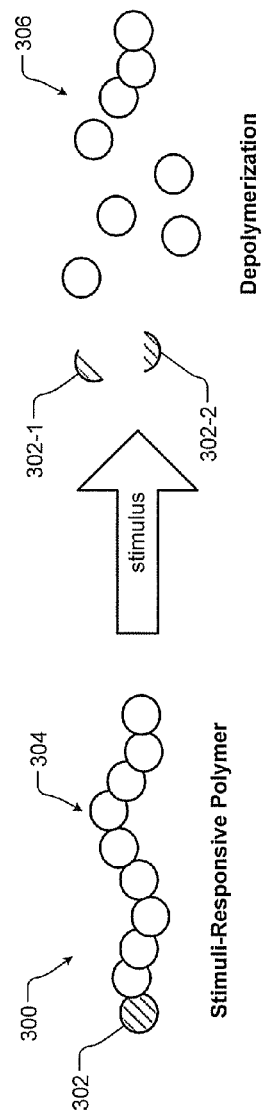
FIG. 3 illustrates an example of a polymer during exposure to stimuli according to the present disclosure.

Referring now to FIG. 3, an example of a stimuli-responsive polymer 300 is shown during exposure to stimuli. The stimuli-responsive polymer 300 undergoes depolymerization in response to the stimuli. In some examples, the stimuli-responsive polymer 300 includes a detection unit 302 and a plurality of monomers 304. Cleavage occurs at the detection unit (as shown at 302-1 and 302-2) after the applied stimuli resulting in head-to-tail depolymerization of a polymer main chain as shown at 306. In this example, the stimuli may include UV light, temperature and/or chemicals such as acid.

Figure 4:
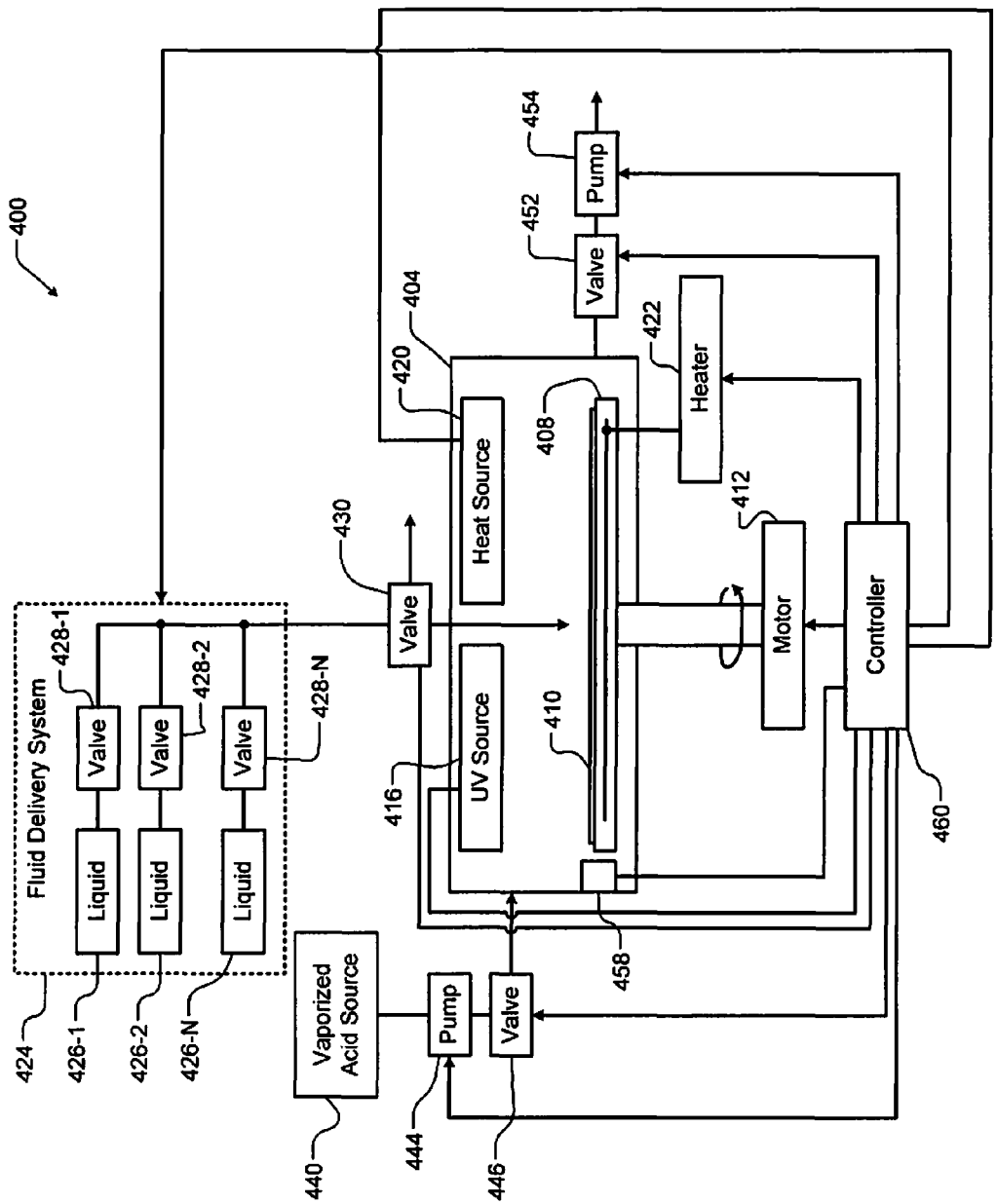
FIG. 4 is a functional block diagram of an example of a system including a spin coating processing chamber according to the present disclosure.

Referring now to FIG. 4, an example of a system 400 including a spin coating processing chamber 404 is shown. A substrate support 408 such as a pedestal or platen may be provided. A substrate 410 is arranged on the substrate support 408. A motor 412 may be used to selectively rotate the substrate support 408 as needed to spin coat liquids on the substrate 410. The spin coating processing chamber 404 may include an ultraviolet (UV) source 416 and/or a heat source 420. The substrate support 408 may include an embedded coil that is connected to a heater 422.

A fluid delivery system 424 is used to deliver one or more liquid sources 426-1, 426-2, . . . , and 426-N (collectively liquid sources 426) to a central portion of the substrate 410. The fluid delivery system 424 may include one or more valves 428-1, 428-2, . . . , and 428-N (collectively valves 428). A diverting valve 430 may be used to flush liquid from the fluid delivery system 424. The fluid delivery system 424 may be configured to deliver fluids for wet etching, wet cleaning, flushing fluid, solvent including the polymer-based structural bracing material, and/or other fluids.

A source 440 of vaporized acid may be provided and delivered to the spin coating processing chamber 404 via a pump 444 and a valve 446. The vaporized acid source may be supplied by passing a push gas through an ampoule containing liquid acid that is heated, although other methods may be used. A valve 452 and a pump 454 may be used to evacuate reactants from the spin coating processing chamber 404 as needed. One or more sensors 458 may be provided to monitor conditions such as temperature, pressure, etc. in the process chamber 404. A controller 460 may be used to control one or more devices in the system 400. More particularly, the controller 460 may be used to control the motor 412, the heater 422, the UV source 416, the heat source 420, the fluid delivery system 424, the pump 444 and the valve 446 associated with the vaporized acid source 440, and/or the valve 452 and the pump 454. The controller 460 may operate in part based on sensed feedback from the one or more sensors 458.

Figure 5A:
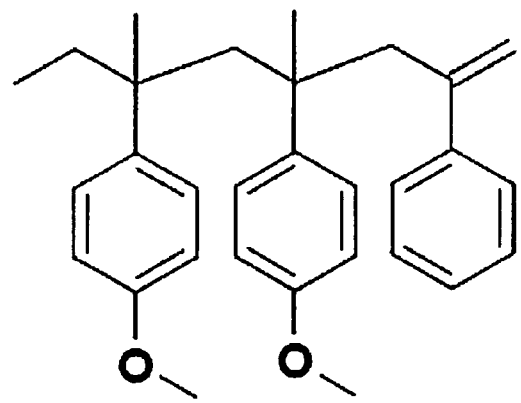
FIGS. 5A-5C illustrate structures of examples of polymer-based bracing materials according to the present disclosure.

In one example, the stimuli-responsive polymer may include poly(para-methoxy-a-methyl styrene) (PMaMS). The PMaMS may have the structure set forth in FIG. 5A. The depolymerization mechanism in this example is head-to-tail scission (end-group triggers). In this example, the stimuli can be acid such as HBr, trifluoroacetic acid, or another acid and/or temperature.

Figure 5B:
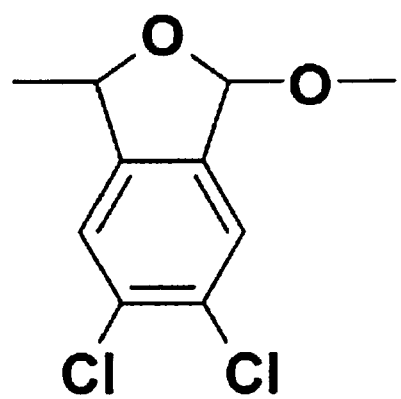

In another example, the stimuli-responsive polymer may include poly(phthalaldehyde) derivative (PPAA). The PPM may have the dichloro-substituted structure set forth in FIG. 5B, although the PPAA may also be un-substituted. The depolymerization mechanism in this example is head-to-tail or main chain scission. In this example, the stimuli can be acid and/or temperature.

Figure 5C:
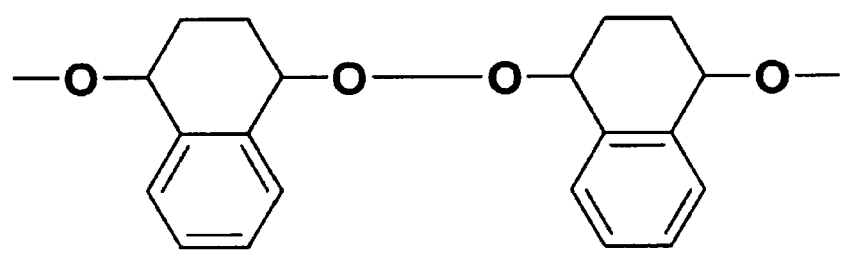

In another example, the stimuli-responsive polymer may include poly(methyl tetrahydronaphthalene) derivative (polyformal). The polyformal may have the structure set forth in FIG. 5C. The depolymerization mechanism in this example is fragmentation in the main chain. In this example, the stimuli can be acid.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems.

The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for drying a substrate including a plurality of high aspect ratio (HAR) structures, comprising:
   after at least one of wet etching and/or wet cleaning the substrate using at least one of wet etching fluid and/or wet cleaning fluid, respectively, and without drying the substrate:
      displacing fluid between the plurality of HAR structures using a solvent including a bracing material, wherein after the solvent evaporates, the bracing material precipitates out of solution and at least partially fills the plurality of HAR structures; and
      exposing the plurality of HAR structures to non-plasma based stimuli to remove the bracing material.

2. The method of claim 1, wherein the bracing material is polymer-based.

3. The method of claim 1, further comprising:
   prior to the exposing, depositing a film including a photo acid generator,
   wherein the non-plasma based stimuli includes radiation.

4. The method of claim 1, further comprising:
   prior to the exposing, depositing a film including a thermal acid generator,
   wherein the non-plasma based stimuli includes elevated temperature.

5. The method of claim 1, wherein:
   the non-plasma based stimuli is provided at a top portion of the plurality of HAR structures; and
   in response to the non-plasma based stimuli, a degradation front moves through the bracing material from a top portion of the bracing material adjacent to the top portion of the plurality of HAR structures to a bottom portion of the bracing material adjacent to a bottom portion of the plurality of HAR structures.

6. The method of claim 1, wherein the fluid between the plurality of HAR structures that is displaced comprises the at least one of the wet etching fluid and/or the wet cleaning fluid.

7. The method of claim 1, further comprising replacing the at least one of the wet etching fluid and/or the wet cleaning fluid with a transition fluid, and wherein the fluid that is displaced includes the transition fluid.

8. The method of claim 1, wherein the non-plasma based stimuli initiates polymer chain scission in the bracing material.

9. The method of claim 1, wherein the non-plasma based stimuli initiates depolymerization in the bracing material.

10. The method of claim 1, wherein the non-plasma based stimuli includes at least one of ultraviolet (UV) light, one or more chemicals, one or more chemical vapors, and/or elevated temperature.

11. The method of claim 1, wherein the solvent including the bracing material is applied to the substrate using spin-coating.

12. The method of claim 1, wherein the method is performed in a processing chamber and further comprising reducing pressure in the processing chamber during and/or after exposing the plurality of HAR structures to the non-plasma based stimuli.

13. The method of claim 1, wherein the method is performed in a processing chamber and wherein the at least one of the wet etching and/or the wet cleaning are also performed in the processing chamber.

14. The method of claim 1, wherein the bracing material includes poly(para-methoxy-a-methyl styrene) and the non-plasma based stimuli includes at least one of acid and/or temperature.

15. The method of claim 14, wherein the acid includes at least one of hydrobromic acid and/or trifluoroacetic acid.

16. The method of claim 1, wherein the bracing material includes poly(phthalaldehyde) and the non-plasma based stimuli includes at least one of acid and/or temperature.

17. The method of claim 1, wherein the bracing material includes poly(methyl tetrahydronaphthalene) derivative and the non-plasma based stimuli includes acid.

* * * * *